US012155193B2

(12) United States Patent
Wu (10) Patent No.: US 12,155,193 B2
(45) Date of Patent: Nov. 26, 2024

(54) POSITIONING TOOL AND BUSBAR MOUNTING METHOD

(71) Applicants:Inventec (Pudong) Technology Corporation, Shanghai (CN); INVENTEC CORPORATION, Taipei (TW)

(72) Inventor: Jun-Long Wu, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 238 days.

(21) Appl. No.: 18/079,066

(22) Filed: Dec. 12, 2022

(65) Prior Publication Data

US 2024/0088638 A1    Mar. 14, 2024

(30) Foreign Application Priority Data

Sep. 13, 2022  (CN) .......................... 202211112146.6

(51) Int. Cl.
*H02G 5/02*         (2006.01)
(52) U.S. Cl.
CPC .................................. *H02G 5/025* (2013.01)
(58) Field of Classification Search
None
See application file for complete search history.

(56) References Cited

U.S. PATENT DOCUMENTS

| | | | |
|---|---|---|---|
| 6,218,615 B1* | 4/2001 | Canonico | H05K 5/0008 220/3.7 |
| 2003/0026084 A1* | 2/2003 | Lauchner | H05K 7/1491 361/826 |
| 2004/0105655 A1* | 6/2004 | Ciulla | H05K 7/18 211/26 |
| 2004/0216911 A1* | 11/2004 | Franz | H02B 1/202 174/72 A |
| 2011/0005068 A1* | 1/2011 | Zhang | H05K 7/18 29/729 |
| 2012/0104205 A1* | 5/2012 | Sculler | H05K 5/0017 248/291.1 |
| 2013/0017693 A1* | 1/2013 | Li | H05K 7/1492 439/110 |
| 2013/0017699 A1* | 1/2013 | Li | G06F 1/188 439/212 |
| 2021/0084789 A1* | 3/2021 | Kuo | H05K 7/183 |
| 2021/0259129 A1* | 8/2021 | Chen | H05K 7/183 |

* cited by examiner

*Primary Examiner* — Krystal Robinson
(74) *Attorney, Agent, or Firm* — Locke Lord LLP; Tim Tingkang Xia, Esq.

(57) ABSTRACT

The invention provides a positioning tool and a busbar mounting method. The positioning tool includes a first mount, a second mount, a first link, a second link and a positioning base. The first mount and the second mount are configured to be mounted on opposite sides of the server cabinet, respectively. The first link and the second link are spaced apart from each other. Opposite ends of the first link are respectively pivotally connected to the first mount and the second mount. Opposite ends of the second link are respectively pivotally connected to the first mount and the second mount. The positioning base is pivotally connected to the first link and the second link. The positioning base is located between the first mount and the second mount and is configured to position the busbar.

10 Claims, 9 Drawing Sheets

POSITIONING TOOL AND BUSBAR MOUNTING METHOD

CROSS-REFERENCE TO RELATED APPLICATIONS

This non-provisional application claims priority under 35 U.S.C. § 119(a) on Patent Application No(s). 202211112146.6 filed in China, on Sep. 13, 2022, the entire contents of which are hereby incorporated by reference.

BACKGROUND OF THE INVENTION

Technical Field of the Invention

The invention relates to a positioning tool and a busbar mounting method, more particularly to a positioning tool and a busbar mounting method for a server cabinet.

Description of the Related Art

In general, in a server cabinet that meets the specification of Open Rack, the direct current power is supplied to one or more servers disposed in the server cabinet via a direct current busbar mounting on the server cabinet. Since there is a significant tolerance between the direct current busbar and the server cabinet, a tool is usually used to help the direct current busbar to be mounted on the server cabinet.

However, conventionally, the tool for mounting the direct current busbar on the server cabinet is usually fixed on posts of the server cabinet via screws. Therefore, the mount or the removal of the tool is required to be performed by screwing the screws into the posts or loosing the screws from the posts. In addition, during the mount of the tool, a technician not only should screw the screws into the posts, but also should observe whether the scale of the tool is aligned with the post or not. Accordingly, it is troublesome for the tool to position the direct current busbar on the server cabinet in a convenient manner.

SUMMARY OF THE INVENTION

The invention is to provide a positioning tool and a busbar mounting method which enable the busbar to be mounted on the server cabinet via the positioning tool in a convenient manner.

One embodiment of this invention provides a positioning tool configured to mount a busbar on a server cabinet. The positioning tool includes a first mount, a second mount, a first link, a second link and a positioning base. The first mount and the second mount are configured to be mounted on opposite sides of the server cabinet, respectively. The first link and the second link are spaced apart from each other. Opposite ends of the first link are respectively pivotally connected to the first mount and the second mount. Opposite ends of the second link are respectively pivotally connected to the first mount and the second mount. The positioning base is pivotally connected to the first link and the second link. The positioning base is located between the first mount and the second mount and is configured to position the busbar.

Another embodiment of this invention provides a busbar mounting method including following steps: providing a positioning tool, where the positioning tool includes a first mount, a second mount, a first link, a second link and a positioning base, the first link and the second link are spaced apart from each other, opposite ends of the first link are respectively pivotally connected to the first mount and the second mount, and opposite ends of the second link are respectively pivotally connected to the first mount and the second mount, the positioning base is pivotally connected to the first link and the second link, and the positioning base is located between the first mount and the second mount; mounting the first mount on a first post of a server cabinet; pivoting the second mount relative to the first mount via the first link and the second link, so as to mount the second mount on a second post of the server cabinet that is spaced apart from the first post; positioning a busbar on the positioning base so as to electrically connect the busbar to a server disposed in the server cabinet; and removing the first mount and the second mount from the first post and the second post, respectively.

According to the positioning tool and the busbar mounting method discussed above, the opposite ends of the first link are respectively pivotally connected to the first mount and the second mount, and the opposite ends of the second link are respectively pivotally connected to the first mount and the second mount. Thus, after the first mount is mounted on a side of the server cabinet, the second mount is allowed to be pivoted relative to the first mount and then to be mounted on the other side of the server cabinet. In this way, the positioning tool can be mounted on the server cabinet regardless of the tolerance therebetween without screws or other adjustment means, which enables the busbar to be mounted on the server cabinet via the positioning tool in a convenient manner.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
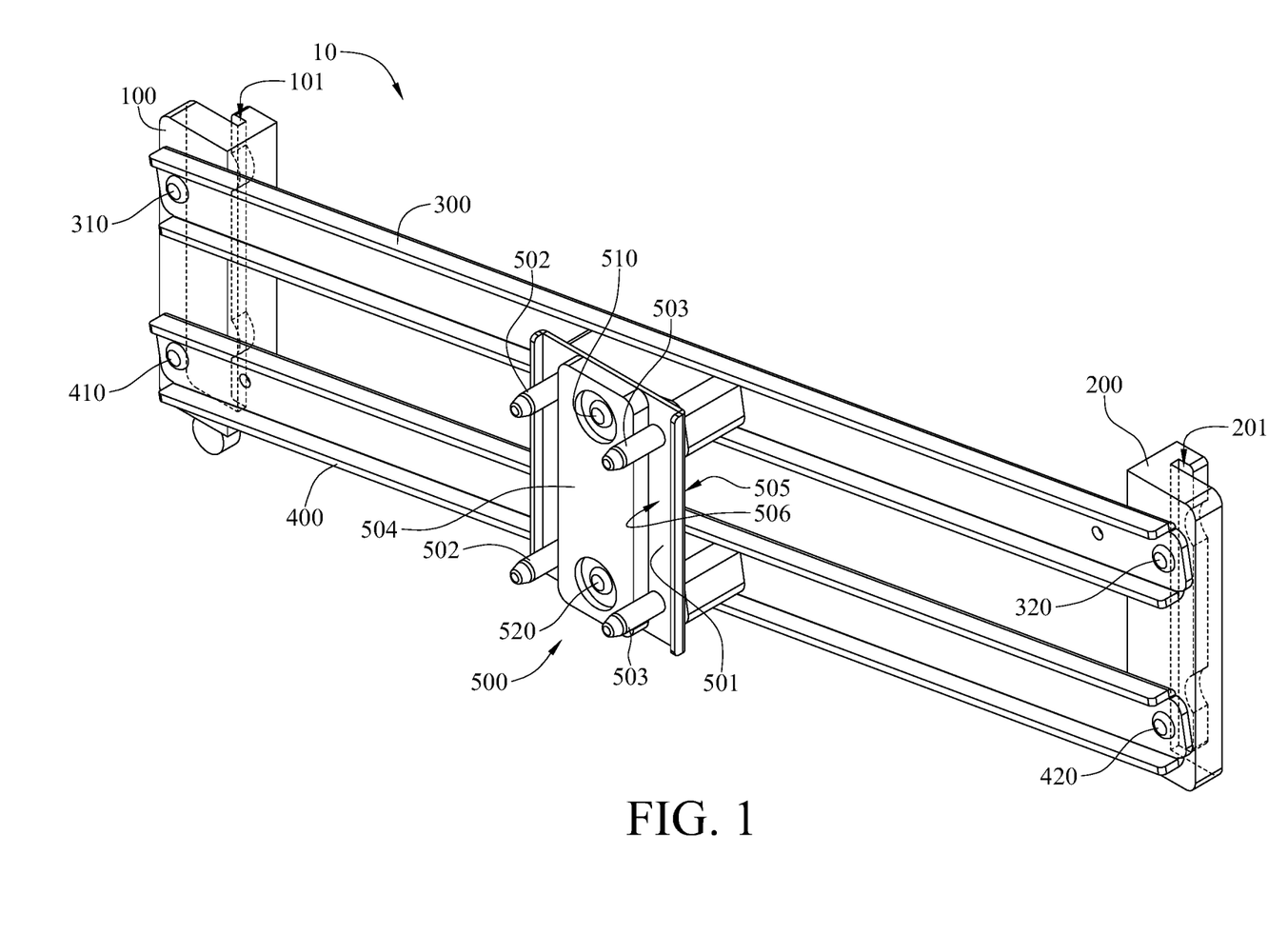
FIG. 1 is a perspective view of a positioning tool according to an embodiment of the invention.
Figure 2:
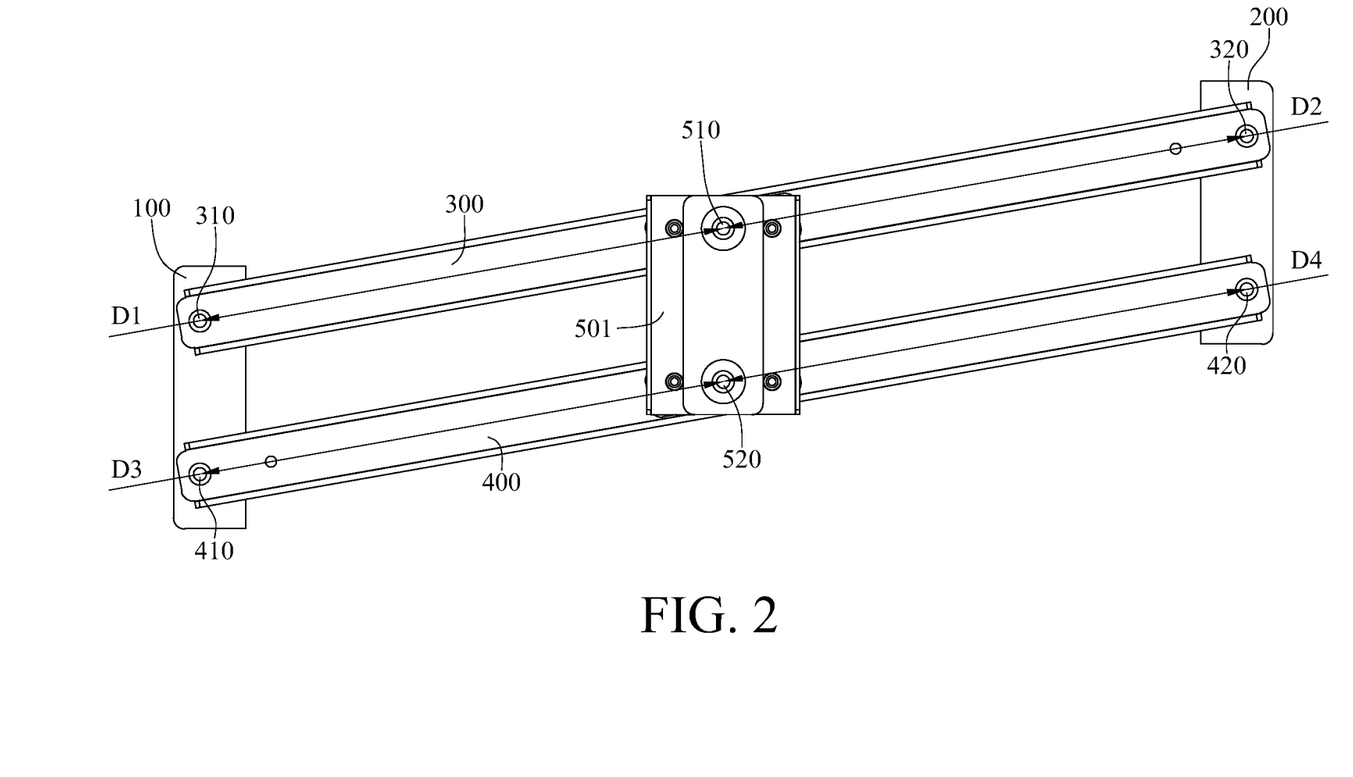
FIG. 2 is a front view of the positioning tool in FIG. 1.

Please refer to FIGS. 1 and 2. FIG. 1 is a perspective view of a positioning tool according to an embodiment of the invention. FIG. 2 is a front view of the positioning tool 10 in FIG. 1.

In this embodiment, the positioning tool 10 includes a first mount 100, a second mount 200, a first link 300, two pivots 310 and 320, a second link 400, two pivots 410 and 420, a positioning base 500 and two pivots 510 and 520.

In this embodiment, the first mount 100 has a first engagement recess 101, and the first engagement recess 101 is located on a side of the first mount 100 located farthest away from the second mount 200. In this embodiment, the second mount 200 has a second engagement recess 201, and the second engagement recess 201 is located on a side of the second mount 200 located farthest away from the first mount 100.

Opposite ends of the first link 300 are pivotally connected to the first mount 100 and the second mount 200 via the two pivots 310 and 320, respectively. Opposite ends of the second link 400 are pivotally connected to the first mount 100 and the second mount 200 via the two pivots 410 and 420, respectively. In addition, the first link 300 and the second link 400 are spaced apart from each other.

In this embodiment, the positioning base 500 includes a main body 501, a plurality of first positioning pins 502, a plurality of second positioning pins 503 and a pad 504. The main body 501 is pivotally connected to the first link 300 and the second link 400 via the pivots 510 and 520, respectively. The main body 501 is located between the first mount 100 and the second mount 200. The main body 501 includes a first surface 505 and a second surface 506 facing away from each other. The first surface 505 faces the first link 300 and the second link 400. The first positioning pins 502 and the second positioning pins 503 protrude from the second surface 506. The pad 504 protrudes from the second surface 506 and is located between the first positioning pins 502 and the second positioning pins 503. In other embodiments, the positioning base may include one first positioning pin and one second positioning pin.

In this embodiment, as shown in FIG. 2, the main body 501 of the positioning base 500 is pivotally connected to a center of the first link 300 and a center of the second link 400. In detail, as shown in FIG. 2, in this embodiment, a distance D1 between the pivot 310 pivotally connecting the first link 300 and the first mount 100 and the pivot 510 pivotally connecting the first link 300 and the main body 501 is equal to a distance D2 between the pivot 320 pivotally connecting the first link 300 and the second mount 200 and the pivot 510 pivotally connecting the first link 300 and the main body 501. In addition, in this embodiment, a distance D3 between the pivot 410 pivotally connecting the second link 400 and the first mount 100 and the pivot 520 pivotally connecting the second link 400 and the main body 501 is equal to a distance D4 between the pivot 420 pivotally connecting the second link 400 and the second mount 200 and the pivot 520 pivotally connecting the second link 400 and the main body 501.

Figure 3:
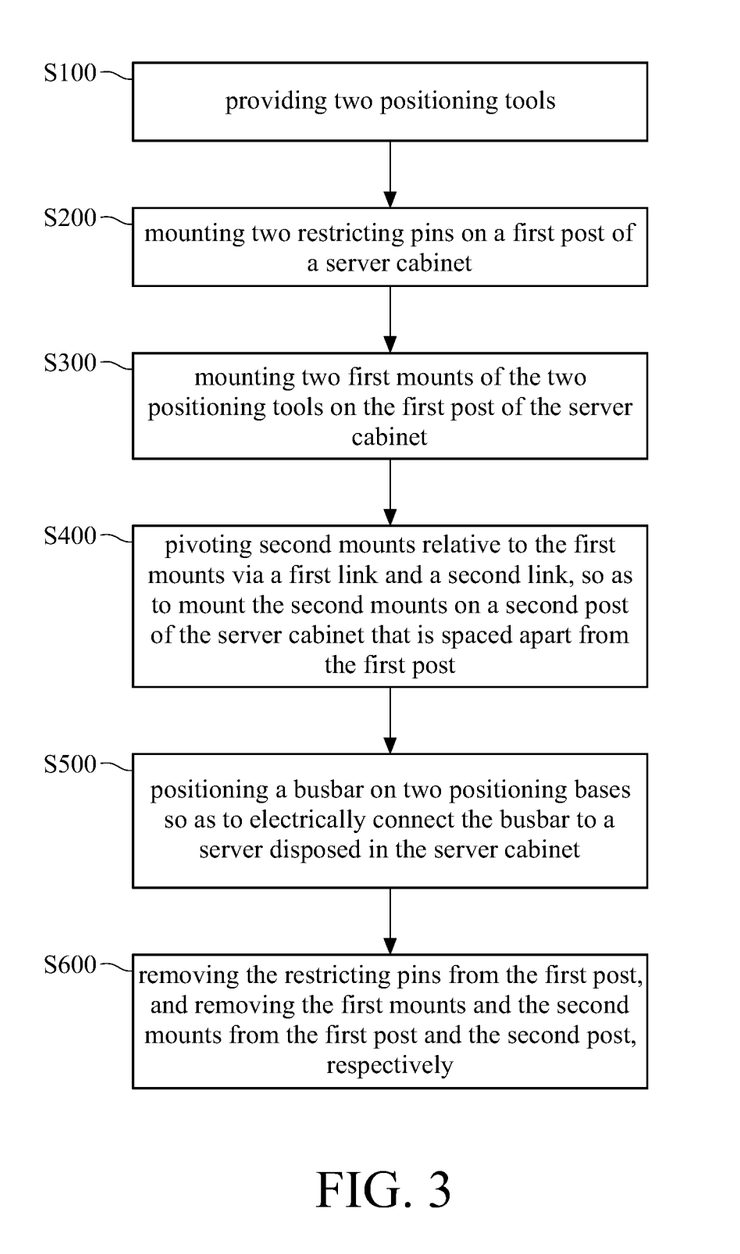
FIG. 3 is a flow chart of a busbar mounting method according to an embodiment of the invention.

Hereinafter, the busbar mounting method according to the invention will be described. Please refer to FIGS. 3 to 9. FIG. 3 is a flow chart of a busbar mounting method according to an embodiment of the invention. FIGS. 4 to 9 show the busbar mounting method in FIG. 3.

First, please refer to FIGS. 1 and 3. As shown in step S100, two positioning tools according to the invention in FIG. 1 are provided. The detail structure of each positioning tool 10 is described above, and thus the repeated descriptions are omitted.

Figure 4:
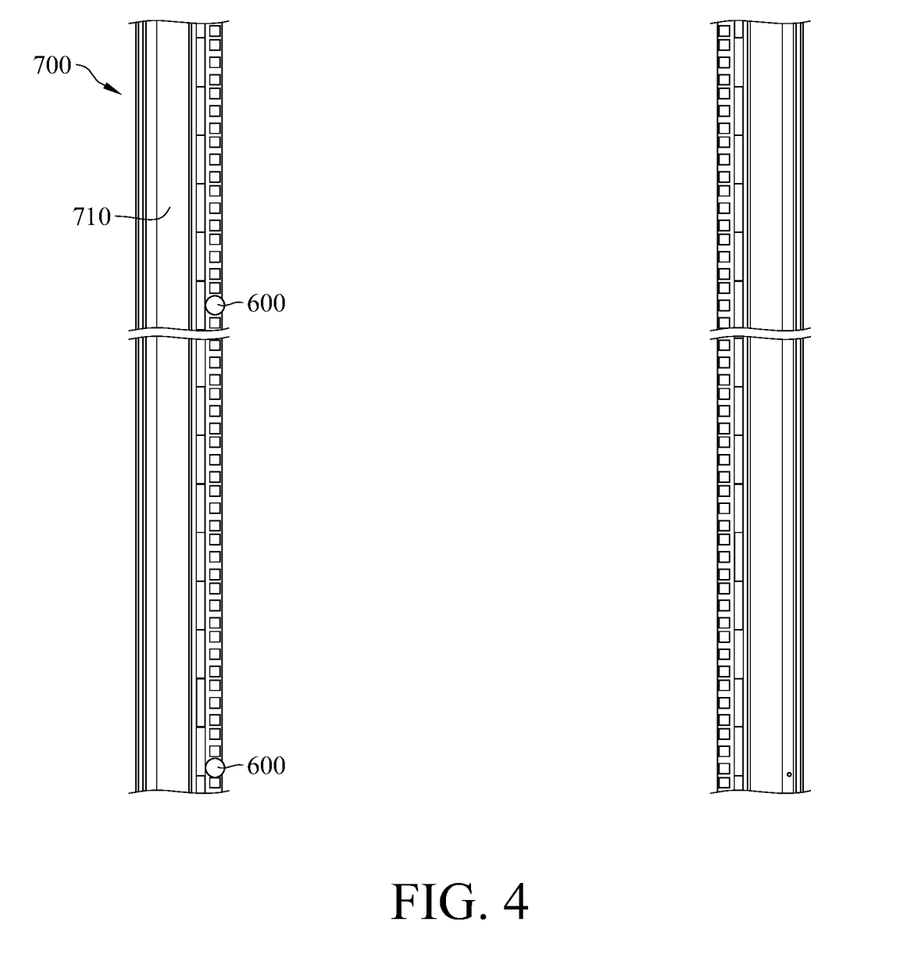
FIGS. 4 to 9 show the busbar mounting method in FIG. 3.

Next, please refer to FIGS. 3 and 4. As shown in step S200, two restricting pins 600 are mounted on a first post 710 of a server cabinet 700. Two restricting pins 600 are spaced apart from each other on the first post 710.

Figure 5:
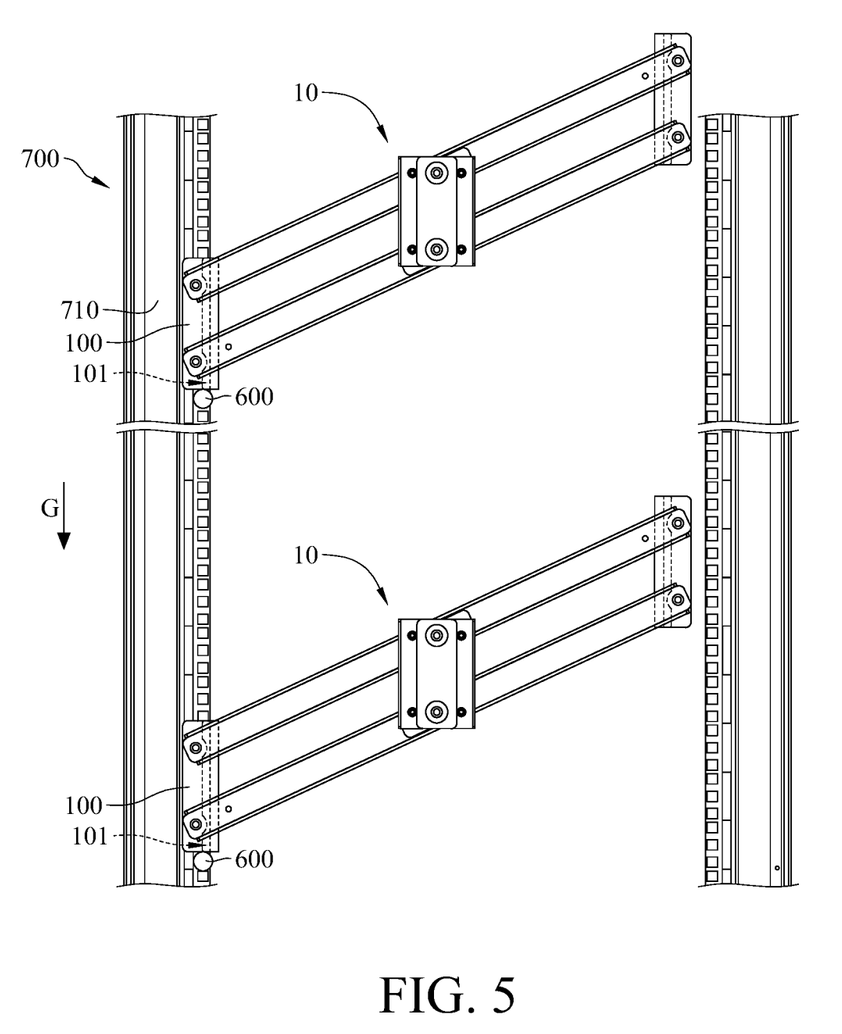

Next, please refer to FIGS. 3 and 5. As shown in step S300, two first mounts 100 of the two positioning tools 10 are mounted on the first post 710 of the server cabinet 700, so as to engage the first post 710 with the first engagement recesses 101 of the two first mounts 100. The two first mounts 100 of the two positioning tools 10 rest on the two restricting pins 600, respectively. In addition, the two restricting pins 600 are located below the two first mounts 100 along a gravitational direction G, respectively. That is, with respect to the first mount 100 and restricting pin 600 that are adjacent to each other, an altitude of the first mount 100 is higher than an altitude of the restricting pins 600.

Figure 6:
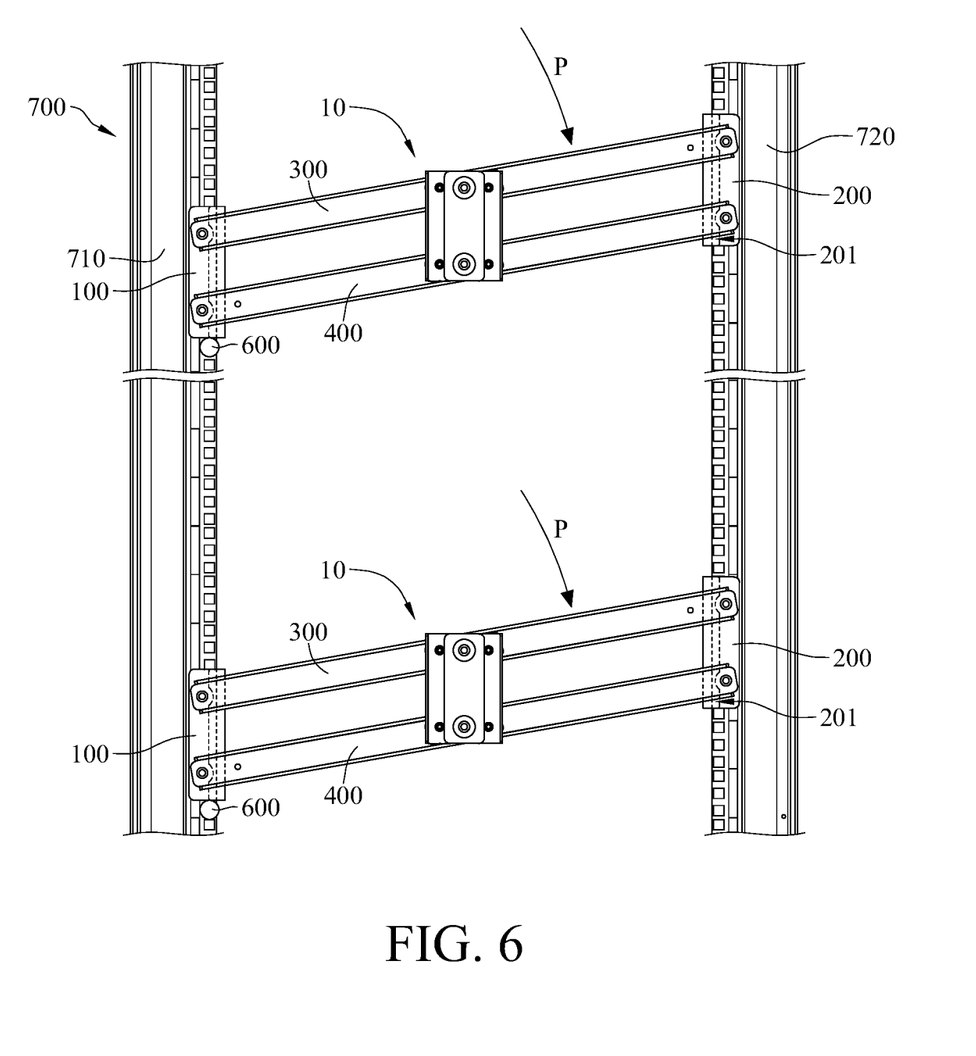

Next, please refer to FIGS. 3 and 6. As shown in step S400, the second mount 200 is pivoted relative to the first mount 100 along a pivoting direction P via the first link 300 and the second link 400, so as to be mounted on a second post 720 of the server cabinet 700 that is spaced apart from the first post 710, thereby engaging the second post 720 with the second engagement recesses 201 of the two second mounts 200. Note that, the second mount 200 of the other positioning tool 10 is mounted on the second post 720 in a similar manner, and thus the repeated descriptions are omitted. In addition, in this embodiment, in each positioning tool 10, the first mount 100 is located below the second mount 200 along the gravitational direction G. That is, in each positioning tool 10, the altitude of the first mount 100 is lower than an altitude of the second mount 200. Thus, the restricting pin 600 supports the first mount 100 that is located below the second mount 200, and thus prevents the positioning tool 10 from being detached from the server cabinet 700, but the invention is not limited thereto. In other embodiments, the restricting pin may support the second mount that is located above the first mount.

Figure 7:
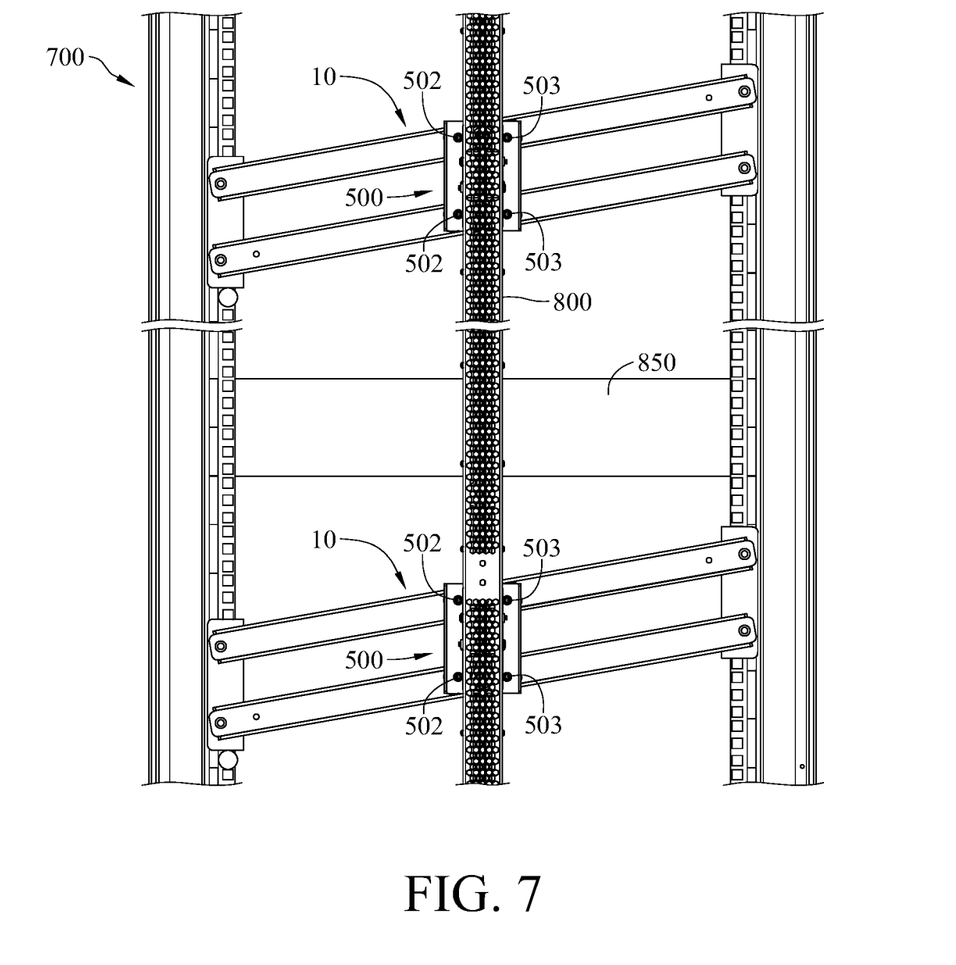
Figure 8:
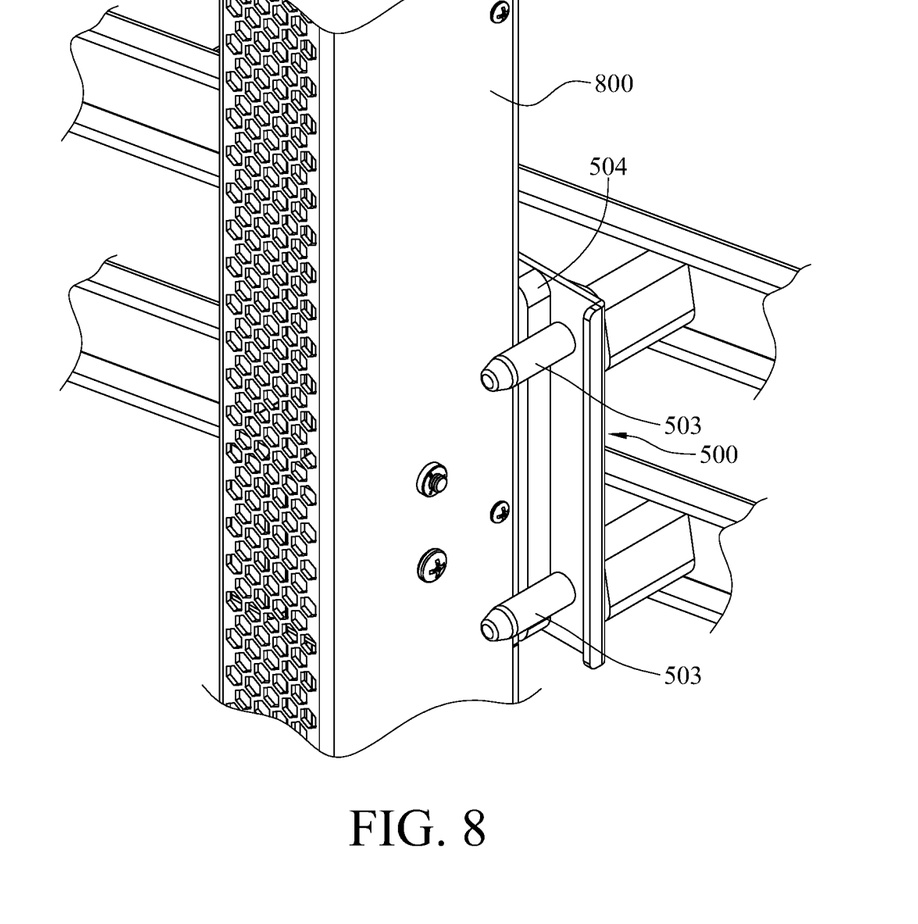

Next, please refer to FIGS. 3, 7 and 8. As shown in step S500, a busbar 800 is positioned on the two positioning bases 500 so as to be electrically connected to a server 850 disposed in the server cabinet 700. Specifically, for each positioning tool 10, the busbar 800 is positioned by the first positioning pins 502 and the second positioning pins 503, so as to be located between the first positioning pins 502 and the second positioning pins 503 and to rest on the pad 504.

Note that different server cabinets 700 have different specifications or tolerances, and thus the first post 710 and the second post 720 may be spaced apart from each other by different distances. However, the busbar 800 according to the invention is required to be positioned on a center between the first post 710 and the second post 720. Thus, in this embodiment, the first mount 100, the second mount 200, the first link 300 and the second link 400 together form a four-bar linkage, and the positioning base 500 is pivotally connected to the center of the first link 300 and the center of the second link 400 as described above. Therefore, even though the distance between the first mount 100 and the second mount 200 may vary with the distance between the first post 710 and the second post 720, the positioning base 500 still is allowed to be spaced apart from the first post 710 and the second post 720 by the desired distance (i.e., being kept at the center between the first post 710 and the second post 720), thereby positioning the busbar 800 accurately.

In other embodiments where the busbar is required to be positioned on another position instead of the center between the first post and the second post to be kept at a specific distance relationship with the first post and the second post. The positioning base may be pivotally connected to a position on the first link and the second link corresponding to the said specific distance relationship, and thus the positioning base is allowed to be kept at the specific distance relationship with the first post and the second post, thereby positioning the busbar accurately.

Figure 9:
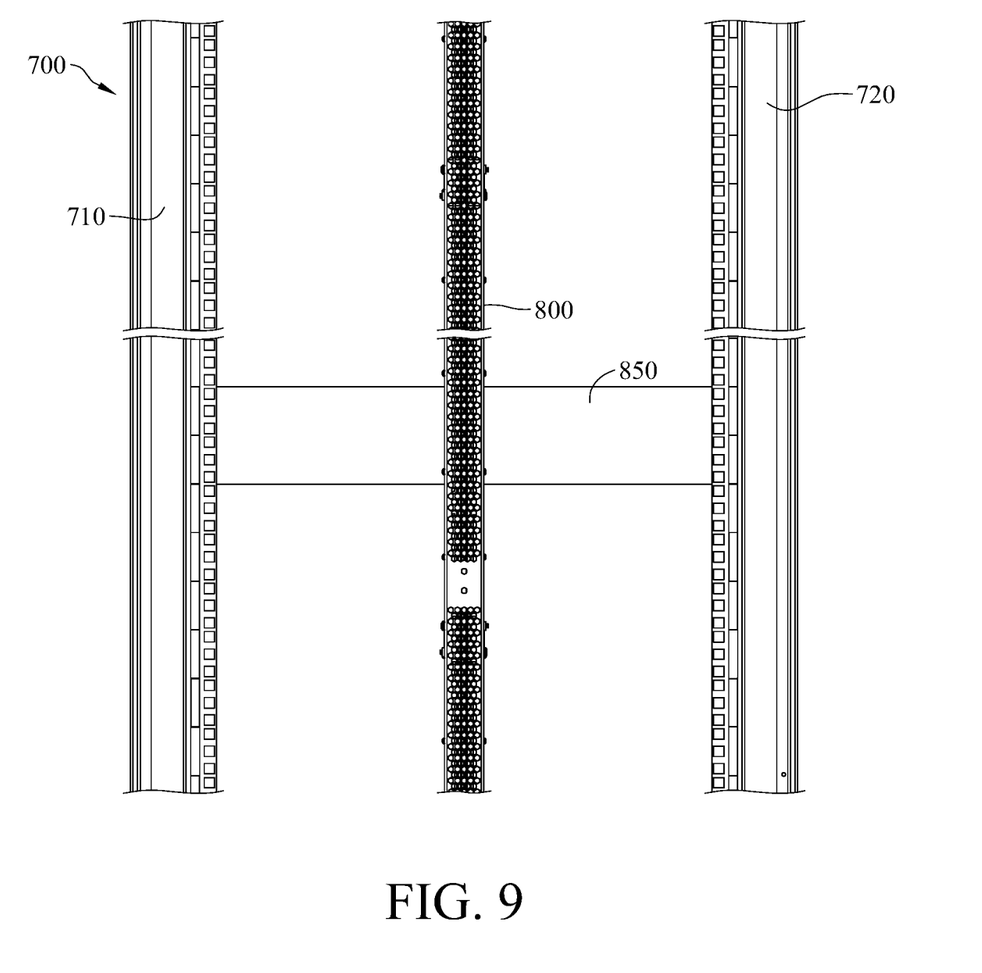

Next, please refer to FIGS. 3, 7 and 9. As shown in step S600, the two restricting pins 600 are removed from the first post 710, and two first mounts 100 and two second mounts 200 of the two positioning tools 10 are removed from the first post 710 and the second post 720, respectively. Then, the mount of the busbar 800 is completed.

Note that in this embodiment, the server to which the positioning tool according to the invention is applied may be used for Artificial Intelligence (AI) computing or edge computing, and may be used as a 5G server, cloud server or Vehicle-to-everything (V2X) server.

According to the positioning tool and the busbar mounting method discussed above, the opposite ends of the first link are respectively pivotally connected to the first mount and the second mount, and the opposite ends of the second link are respectively pivotally connected to the first mount and the second mount. Thus, after the first mount is mounted on a side of the server cabinet, the second mount is allowed to be pivoted relative to the first mount and then to be mounted on the other side of the server cabinet. In this way, the positioning tool can be mounted on the server cabinet regardless of the tolerance therebetween without screws or other adjustment means, which enables the busbar to be mounted on the server cabinet via the positioning tool in a convenient manner.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A positioning tool, configured to mount a busbar on a server cabinet, the positioning tool comprising:
   a first mount and a second mount, configured to be mounted on opposite sides of the server cabinet, respectively;
   a first link and a second link, spaced apart from each other, wherein opposite ends of the first link are respectively pivotally connected to the first mount and the second mount, and opposite ends of the second link are respectively pivotally connected to the first mount and the second mount; and
   a positioning base, pivotally connected to the first link and the second link, wherein the positioning base is located between the first mount and the second mount and is configured to position the busbar.

2. The positioning tool according to claim 1, wherein the positioning base is pivotally connected to a center of the first link and a center of the second link.

3. The positioning tool according to claim 1, wherein the positioning base comprises a main body, at least one first positioning pin and at least one second positioning pin, the main body is pivotally connected to the first link and the second link, the main body includes a first surface and a second surface facing away from each other, the first surface faces the first link and the second link, the at least one first positioning pin and the at least one second positioning pin protrude from the second surface, the at least one first positioning pin and the at least one second positioning pin are configured to position the busbar so as to allow the busbar to be located between the at least one first positioning pin and the at least one second positioning pin.

4. The positioning tool according to claim 3, wherein the positioning base further comprises a pad, the pad protrudes from the second surface and is located between the at least one first positioning pin and the at least one second positioning pin, and the pad is configured for the busbar to rest thereon.

5. A busbar mounting method, comprising:
   providing a positioning tool, wherein the positioning tool comprises a first mount, a second mount, a first link, a second link and a positioning base, the first link and the second link are spaced apart from each other, opposite ends of the first link are respectively pivotally connected to the first mount and the second mount, and opposite ends of the second link are respectively pivotally connected to the first mount and the second mount, the positioning base is pivotally connected to the first link and the second link, and the positioning base is located between the first mount and the second mount;
   mounting the first mount on a first post of a server cabinet;
   pivoting the second mount relative to the first mount via the first link and the second link, so as to mount the second mount on a second post of the server cabinet that is spaced apart from the first post;
   positioning a busbar on the positioning base so as to electrically connect the busbar to a server disposed in the server cabinet; and
   removing the first mount and the second mount from the first post and the second post, respectively.

6. The busbar mounting method according to claim 5, further comprising a step of mounting a restricting pin on the first post before the step of mounting the first mount on the first post of the server cabinet, wherein the restricting pin is located below the first mount along a gravitational direction.

7. The busbar mounting method according to claim 6, wherein the first mount is located below the second mount along the gravitational direction.

8. The busbar mounting method according to claim 5, wherein the positioning base is pivotally connected to a center of the first link and a center of the second link.

9. The busbar mounting method according to claim 5, wherein the positioning base comprises a main body, at least one first positioning pin and at least one second positioning pin, the main body is pivotally connected to the first link and the second link, the main body includes a first surface and a second surface facing away from each other, the first surface faces the first link and the second link, the at least one first positioning pin and the at least one second positioning pin protrude from the second surface, the at least one first positioning pin and the at least one second positioning pin position the busbar so as to allow the busbar to be located between the at least one first positioning pin and the at least one second positioning pin.

10. The busbar mounting method according to claim 9, wherein the positioning base further comprises a pad, the pad protrudes from the second surface and is located between the at least one first positioning pin and the at least one second positioning pin, and the pad is configured for the busbar to rest thereon.

* * * * *